(12) United States Patent
Sanahuja Clot et al.

(10) Patent No.: US 10,814,801 B2
(45) Date of Patent: Oct. 27, 2020

(54) EMBLEM FOR VEHICLES

(71) Applicant: Zanini Auto Grup, S.A., Parets del Valles (ES)

(72) Inventors: José Sanahuja Clot, Parets del Valles (ES); Augusto Mayer Pujadas, Parets del Valles (ES)

(73) Assignee: Zanini Auto Grup, S.A., Parets del Valles (Barcelona) (ES)

( * ) Notice: Subject to any disclaimer, the term of this patent is extended or adjusted under 35 U.S.C. 154(b) by 0 days.

(21) Appl. No.: 16/047,154

(22) Filed: Jul. 27, 2018

(65) Prior Publication Data
US 2019/0031118 A1    Jan. 31, 2019

(30) Foreign Application Priority Data
Jul. 27, 2017  (EP) ..................................... 17382500

(51) Int. Cl.
*B60Q 1/00*       (2006.01)
*B60R 13/00*      (2006.01)
(Continued)

(52) U.S. Cl.
CPC .............. *B60R 13/005* (2013.01); *B32B 1/00* (2013.01); *B32B 3/08* (2013.01); *B32B 3/263* (2013.01);
(Continued)

(58) Field of Classification Search
CPC . B60R 13/005; B60R 19/52; B60R 2019/525; B32B 2590/00; B32B 2451/00; B32B 27/08; B32B 1/00; B32B 3/08; B32B 3/30; B32B 3/263; B32B 2307/41; B32B 2307/4023; B32B 2307/414; B32B 2307/416; B32B 2250/44; B32B 2605/08; B32B 2307/40; B32B 2307/412; B32B 2255/10; B32B 2255/205; F21W 2104/00; F21W 2121/00; B60Q 1/0011;
(Continued)

(56) References Cited

U.S. PATENT DOCUMENTS 5,699,188 A * 12/1997 Gilbert ................... B32B 27/36
                                                          359/584
5,947,578 A *  9/1999 Ayres ................... G02B 6/0021
                                                          362/255
(Continued)

FOREIGN PATENT DOCUMENTS

WO      2012/066417       5/2012

*Primary Examiner* — Isiaka O Akanbi
*Assistant Examiner* — Fatima N Farokhrooz
(74) *Attorney, Agent, or Firm* — Gardner, Linn, Burkhart & Ondersma LLP

(57) ABSTRACT

An emblem for vehicles includes a substrate formed of a light-transmissive resin, the substrate having a proximal face and a distal face and a decoration layer applied to the proximal face, the decoration layer including a metalloid or a metalloid alloy deposited on the surface of the proximal face, a transparent frontal cover overlying the decoration layer, and a light source that illuminates the substrate, so that the light from the light source crosses the transparent frontal cover. This permits the emblem to maintain its metallic aspect in any lighting condition, so that the decorative function is be improved by adding illumination in appropriate conditions while preserving its 3-D image.

13 Claims, 3 Drawing Sheets

(51) Int. Cl.

| | | |
|---|---|---|
| *B32B 27/08* | (2006.01) | |
| *B32B 1/00* | (2006.01) | |
| *B32B 3/08* | (2006.01) | |
| *B32B 3/30* | (2006.01) | |
| *B32B 3/26* | (2006.01) | |
| *F21S 41/30* | (2018.01) | |
| *B60Q 1/26* | (2006.01) | |
| *B60R 19/52* | (2006.01) | |
| *C23C 14/20* | (2006.01) | |
| *F21V 3/02* | (2006.01) | |
| *F21Y 115/10* | (2016.01) | |
| *C23C 14/35* | (2006.01) | |
| *F21W 121/00* | (2006.01) | |

(52) U.S. Cl.
CPC .............. *B32B 3/30* (2013.01); *B32B 27/08* (2013.01); *B60Q 1/0011* (2013.01); *B60Q 1/2661* (2013.01); *B60R 19/52* (2013.01); *C23C 14/20* (2013.01); *F21S 41/30* (2018.01); *F21V 3/02* (2013.01); *B32B 2250/44* (2013.01); *B32B 2255/10* (2013.01); *B32B 2255/205* (2013.01); *B32B 2307/40* (2013.01); *B32B 2307/4023* (2013.01); *B32B 2307/41* (2013.01); *B32B 2307/412* (2013.01); *B32B 2307/414* (2013.01); *B32B 2307/416* (2013.01); *B32B 2451/00* (2013.01); *B32B 2551/00* (2013.01); *B32B 2590/00* (2013.01); *B32B 2605/08* (2013.01); *B60R 2019/525* (2013.01); *C23C 14/35* (2013.01); *F21W 2121/00* (2013.01); *F21Y 2115/10* (2016.08)

(58) Field of Classification Search
CPC ........ B60Q 1/2661; F21S 41/30; C23C 14/20; C23C 14/35; F21V 3/02; F21Y 2115/10
See application file for complete search history.

(56) References Cited

U.S. PATENT DOCUMENTS

| | | | |
|---|---|---|---|
| 6,769,798 B2* | 8/2004 | Mishimagi | B60Q 1/2665 362/522 |
| 9,114,760 B2 | 8/2015 | Mayer Pajudas | |
| 2002/0024808 A1* | 2/2002 | Suehiro | H01L 33/60 362/245 |
| 2002/0057579 A1* | 5/2002 | Ohkodo | G02B 6/0073 362/554 |
| 2003/0128549 A1* | 7/2003 | Matsuura | B60Q 1/56 362/497 |
| 2004/0080958 A1* | 4/2004 | Bukosky | B60Q 1/2665 362/494 |
| 2006/0066192 A1* | 3/2006 | Beeson | G02B 27/28 313/112 |
| 2006/0203468 A1* | 9/2006 | Beeson | G02B 27/286 362/84 |
| 2008/0063874 A1* | 3/2008 | Rakow | C03C 17/38 428/426 |
| 2009/0109538 A1* | 4/2009 | Kitayama | C08F 2/44 359/599 |
| 2009/0257001 A1* | 10/2009 | Sumida | G02B 6/0033 349/65 |
| 2014/0003060 A1* | 1/2014 | Okada | G02B 5/0268 362/311.02 |
| 2014/0003075 A1* | 1/2014 | Yamada | B60Q 1/0035 362/511 |
| 2014/0042467 A1* | 2/2014 | Livesay | H01L 24/73 257/88 |
| 2015/0241621 A1* | 8/2015 | Inui | G02F 1/133615 349/65 |
| 2017/0101047 A1* | 4/2017 | Dellock | B60Q 1/2603 |
| 2017/0357044 A1* | 12/2017 | Kuramitsu | B60Q 1/50 |
| 2019/0071006 A1* | 3/2019 | Schmidt | B60R 13/005 |

* cited by examiner

EMBLEM FOR VEHICLES

FIELD OF THE INVENTION

The present invention relates to automotive emblems, and in particular to automotive emblems presenting a decorative image during the day and a back-lighted image at night.

BACKGROUND

Commonly-owned WO2012066417A1 discloses a decorative radar emblem including a substrate made of a radio transmissive resin, a decoration layer including a plurality of metalloid or metalloid alloy (Si, Ge) layers applied to the substrate proximal face, a radio transmissive resin overlying the decoration layer, the resin overlying the decoration layer including a decoration ink overlay. However, in this radome, its metallic aspect can be lost in the absence of ambient light.

SUMMARY OF THE INVENTION

The present invention provides various advantages in an emblem for vehicles, improving decorative function by adding illumination in appropriate conditions. In one aspect, the emblem for vehicles includes:
- a substrate formed of a light diffusing resin, the substrate having a proximal face and a distal face and a decoration layer applied to the proximal face, the decoration layer including a metalloid or a metal alloy deposited on the surface of the proximal face,
- a transparent frontal cover overlying the decoration layer, and
- a light source that illuminates the substrate, so that the light from the light source crosses the transparent frontal cover.

Optionally, the emblem for vehicles also includes a rear transparent cover, with the light source placed in the rear transparent cover in such a way that the coupling of the light source on the rear transparent cover is maximized. This allows the light rays to propagate freely and unobstructed inside the whole rear transparent cover body before being projected towards the vehicle forward direction.

According to two alternative embodiments, the decoration layer is translucent, or the decoration layer is opaque and it is applied only to a portion of the proximal face of the substrate leaving gaps for the passage of light from the light source.

Advantageously, the rear transparent cover includes an optical reflective coating on its side opposite to the substrate, for reflecting the light from the light source towards the vehicle forward direction.

Optionally, the transparent frontal cover includes at least one pad or decoration on one or more its portions on the side in contact with the substrate.

The metalloid or the metalloids of the alloy are generally selected from Germanium, Boron, Silicon, Arsenic, Antimony and/or Tellurium.

It will be appreciated that the emblem as described previously would be mounted to, or used in combination with, a vehicle including a front grill assembly, the emblem optionally being positioned within the grill assembly.

Therefore, the emblem of the present invention maintains its metallic aesthetic aspect in substantially any lighting condition, so that the decorative function is improved by adding illumination in appropriate conditions while preserving the 3-D image.

These and other objects, advantages and features of the invention will become apparent upon review of the following specification in conjunction with the drawings.

DETAILED DESCRIPTION

First of all, in the present specification and in the attached claims by the term "metalloid" is meant at least any of the following compounds: Germanium, Boron, Silicon, Arsenic, Antimony and/or Tellurium.

PVD magnetron sputtering is the method employed for the deposition of metalloid over a substrate. Due to the nature of sputtering deposition, uniformity of the decoration layer can be substantially guaranteed.

Figure 1:
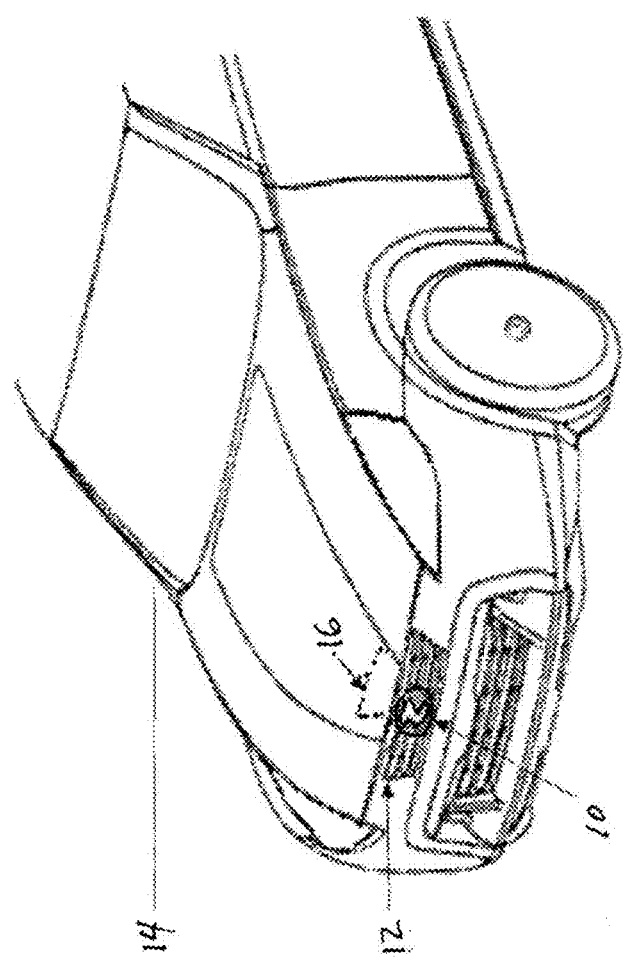
FIG. 1 is a perspective view of a vehicle provided with the emblem in accordance with the present invention.
Figure 2:
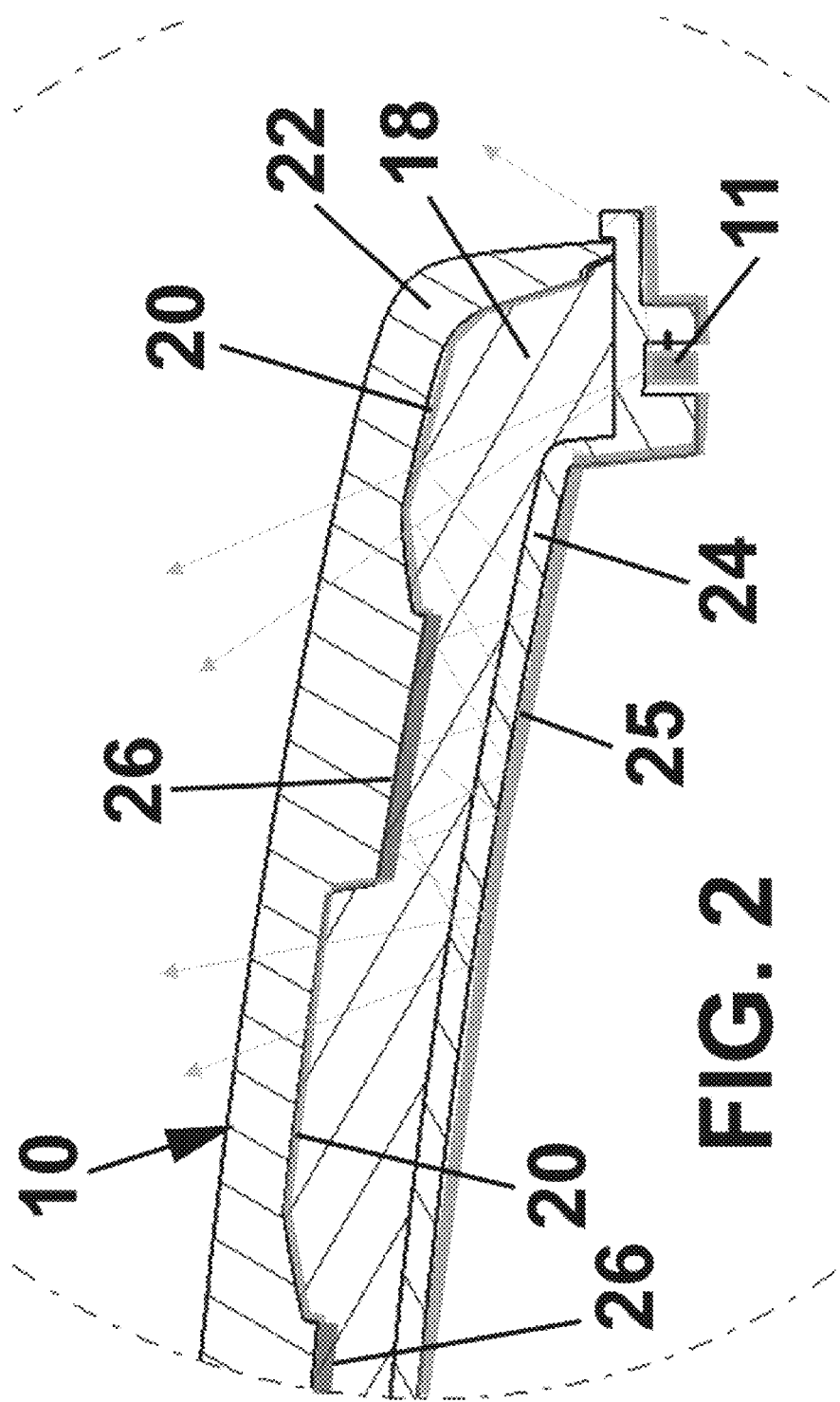
FIG. 2 is a cross-section of a portion of the emblem in accordance with the present invention according to a first embodiment.

With reference now in detail to the drawings, wherein like numerals will be employed to denote like components throughout, as illustrated in FIG. 1, the reference numeral 10 denotes generally a decorative emblem constructed in accordance with and embodying the invention configured for mounting within a grill assembly 12 of a motor vehicle FIG. 2 is a cross section of the emblem 10 according to a first embodiment.

In this first embodiment, the emblem 10 includes a frontal transparent cover 22 that can be made from an injected transparent material with excellent optical properties.

This frontal transparent cover 22 can include one or more pads 26 printed on it, or by any other suitable decoration method such as over-injection or hot stamping, and it can also include indentations and recesses on the internal surface, as shown in FIG. 2.

The emblem 10 also includes an intermediate substrate 18, which may be injected with a light diffusion material that scatters light, and a decoration layer 20 made from a metalloid or a metal alloy, that is optionally coated by PVD Magnetron Sputtering, using a low electrical conductivity element with metallic aspect.

The thickness of the decoration layer 20 is such that light is partially reflected and partially transmitted, but the metallic aspect is clearly visible in daylight conditions.

This intermediate substrate 18 can also include indentations and recesses on one of its surfaces, complimentary to those of the frontal transparent cover 22.

The emblem 10 also includes a rear transparent cover 24, which may be made from injected transparent material having excellent optical properties, and over-injected on top of a surface of the substrate 18.

This rear transparent cover 24 also may include a reflective coating on the distal surface, e.g. applied by PVD Magnetron Sputtering or white reflective paint.

The emblem 10 also includes a light source 11, that can be coupled to the rear transparent cover 24, and that can be made from one or more LEDs, or any other suitable light source in terms of intensity and color.

In this embodiment, the decoration layer 20 is translucent, so that part of the light from the light source 11 can cross this decoration layer 20, as shown by the arrows in FIG. 2.

It should be appreciated that the emblem according to the present embodiment can also include a top coat added to the front, or to front and rear emblem surfaces, and that the decorations on the front transparent cover (e.g. the one or more pads 26) and on the substrate 18 (the decoration layer 20) are aligned, with no gaps between them. As shown by the arrows in FIG. 2, the illumination is visible through the decoration coating 20, as part of the light is reflected and part is transmitted.

Figure 3:
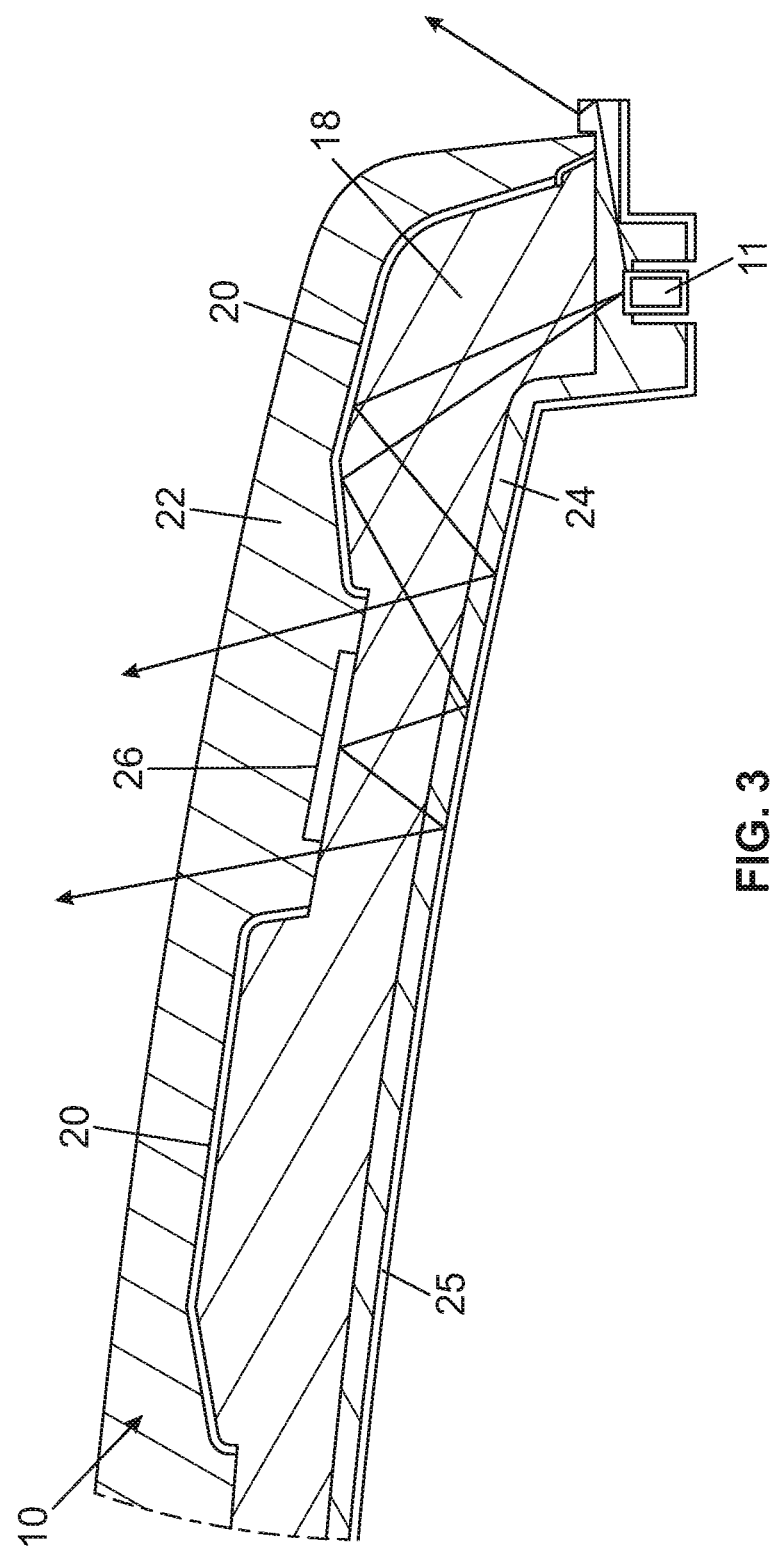
FIG. 3 is a cross-section of a portion of the emblem in accordance with the present invention according to a second embodiment.

FIG. 3 shows a second embodiment of emblem 11. In this embodiment, the same numeral references are used for identifying the same or equivalent elements for clarity reasons. Furthermore, only the differences between this second embodiment with the first embodiment are described for simplicity reasons.

The main difference from the first embodiment is that the decoration layer 20 is opaque, and reflects the light back to the reflective coating 25 of the rear transparent cover 24. For this reason, the decoration on the front transparent cover 22 (e.g. the at least one pad 26) and on the substrate 18 (the decoration layer 20) are not aligned, so that there is a gap between them, for instance following any identifiable brand logo shapes.

Therefore, illumination is visible through the existing gap between the decoration layer 20 and the pad(s) 26.

Since various possible embodiments might be made of the present invention and since various changes might be made in the exemplary embodiment shown herein without departing from the spirit of the invention, is to be understood that all matter herein described or shown in the accompanying drawings is to be interpreted as illustrative and not in a limiting sense. Accordingly, the present invention is intended to be limited only by the scope of the appended claims as interpreted according to the principles of patent law including the doctrine of equivalents.

the invention claimed is:

1. An emblem for vehicles, the emblem comprising:
a substrate formed of a light diffusing resin, the substrate having a proximal face, a distal face spaced from and generally paralleling the proximal face, and a decoration layer applied to only a portion of the proximal face leaving translucent gaps along the proximal face, the decoration layer comprising a metalloid or a metalloid alloy deposited directly on and adhered to the surface of the proximal face;
a transparent frontal cover overlying the decoration layer;
a rear transparent cover having an optical reflective coating on a side of the rear transparent cover that is opposite to the substrate, the rear transparent cover defining a recess along a peripheral region at the side opposite to the substrate; and
a light source positioned in the recess in the rear transparent cover and configured to illuminate the substrate, wherein light from the light source crosses the transparent frontal cover;
wherein the optical reflective coating is configured to reflect the light from the light source; and
wherein the decoration layer has a thickness such that the light from the light source is partially reflected by the decoration layer and is partially transmitted through the decoration layer, and wherein light passes from the light source through the translucent gaps.

2. The emblem of claim 1, wherein the transparent frontal cover comprises at least one pad on one or more its portions on the side in contact with the substrate.

3. The emblem of claim 1, wherein the metalloid or the metal of the alloy comprises at least one chosen from Germanium, Boron, Silicon, Arsenic, Aluminum, Zirconium, Titanium, Stainless-steel, Chrome Antimony, and Tellurium.

4. The emblem of claim 1, further in combination with a vehicle comprising a front grill assembly, wherein the emblem is positioned within the front grill assembly.

5. The emblem of claim 1, wherein the optical reflective coating defines a gap at the recess formed in the rear transparent cover, wherein the optical reflective coating substantially surrounds the recess.

6. The emblem of claim 1, wherein other light from the light source is emitted outwardly through the rear transparent cover and is emitted at an outer periphery of the emblem without passing through the substrate or the front cover.

7. The emblem of claim 1, wherein the rear transparent cover extends laterally outboard of both the substrate and the frontal cover, wherein an outer periphery of the rear transparent cover forms the outermost lateral extent of the emblem and comprises an outer end wall that is at least partially reflective, and wherein additional light from the light source is reflected by the outer end wall of the rear transparent cover.

8. The emblem of claim 7, wherein the outer periphery of the rear transparent cover extends forwardly of a respective portion of each of the substrate and the frontal cover and defines a forward periphery surface for emitting at least some of the additional light reflected by the outer end wall of the rear transparent cover.

9. An emblem for vehicles, the emblem comprising:
a substrate formed of a light diffusing resin, the substrate having a proximal face, a distal face spaced from and generally paralleling the proximal face, and a decoration layer applied to only a portion of the proximal face leaving translucent gaps along the proximal face, the decoration layer comprising a metalloid or a metalloid alloy deposited directly on and adhered to the surface of the proximal face;
a transparent frontal cover overlying the decoration layer;
a rear transparent cover having an optical reflective coating on a side of the rear transparent cover that is opposite to the substrate, the rear transparent cover extending laterally outboard of both the substrate and the frontal cover, wherein an outer periphery of the rear transparent cover forms the outermost lateral extent of the emblem and comprises an outer end wall that is at least partially reflective; and
a light source positioned in the rear transparent cover and configured to illuminate the substrate, wherein light from the light source crosses the transparent frontal cover, and wherein additional light from the light source is reflected by the outer end wall of the rear transparent cover;
wherein the optical reflective coating is configured to reflect the light from the light source; and
wherein the decoration layer has a thickness such that the light from the light source is partially reflected by the decoration layer and is partially transmitted through the decoration layer, and wherein light passes from the light source through the translucent gaps.

10. The emblem of claim 9, wherein the outer periphery of the rear transparent cover extends forwardly of a respective portion of each of the substrate and the frontal cover and defines a forward periphery surface for emitting at least some of the additional light reflected by the outer end wall of the rear transparent cover.

11. The emblem of claim 9, wherein the transparent frontal cover comprises at least one pad on one or more its portions on the side in contact with the substrate.

12. The emblem of claim 9, wherein the metalloid or the metal of the alloy comprises at least one chosen from Germanium, Boron, Silicon, Arsenic, Aluminum, Zirconium, Titanium, Stainless-steel, Chrome Antimony, and Tellurium.

13. The emblem of claim 9, further in combination with a vehicle comprising a front grill assembly, wherein the emblem is positioned within the front grill assembly.

\* \* \* \* \*